US009614059B2

(12) United States Patent
Colinge

(10) Patent No.: US 9,614,059 B2
(45) Date of Patent: Apr. 4, 2017

(54) FORMING CONDUCTIVE STI LINERS FOR FINFETS

(71) Applicant: Taiwan Semiconductor Manufacturing Company, Ltd., Hsin-Chu (TW)

(72) Inventor: Jean-Pierre Colinge, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/977,329

(22) Filed: Dec. 21, 2015

(65) Prior Publication Data

US 2016/0111526 A1  Apr. 21, 2016

Related U.S. Application Data

(62) Division of application No. 14/052,328, filed on Oct. 11, 2013, now Pat. No. 9,219,115.

(51) Int. Cl.
| | |
|---|---|
| *H01L 29/06* | (2006.01) |
| *H01L 29/66* | (2006.01) |
| *H01L 29/78* | (2006.01) |
| *H01L 21/762* | (2006.01) |
| *H01L 21/28* | (2006.01) |
| *H01L 21/3205* | (2006.01) |

(52) U.S. Cl.
CPC .. *H01L 29/66795* (2013.01); *H01L 21/28017* (2013.01); *H01L 21/32055* (2013.01); *H01L 21/76224* (2013.01); *H01L 29/0649* (2013.01); *H01L 29/6656* (2013.01); *H01L 29/785* (2013.01)

(58) Field of Classification Search
CPC ........... H01L 29/66795; H01L 29/6656; H01L 21/28017; H01L 21/32055; H01L 29/0649; H01L 29/785; H01L 21/76224
USPC .......................................................... 257/394
See application file for complete search history.

(56) References Cited

U.S. PATENT DOCUMENTS

| | | | |
|---|---|---|---|
| 6,177,699 B1 | 1/2001 | Perng et al. | |
| 8,158,468 B2 * | 4/2012 | Masuoka | H01L 29/42392 257/329 |
| 8,372,746 B2 | 2/2013 | Do et al. | |
| 2005/0104096 A1 * | 5/2005 | Lee | H01L 21/823842 257/288 |
| 2007/0048947 A1 * | 3/2007 | Lee | H01L 21/26586 438/283 |

(Continued)

*Primary Examiner* — Marc Armand
*Assistant Examiner* — Sue Tang
(74) *Attorney, Agent, or Firm* — Slater Matsil, LLP

(57) ABSTRACT

An integrated circuit device, and a method of forming, including a semiconductor substrate, isolation regions extending into the semiconductor substrate, a semiconductor strip, and a semiconductor fin overlapping and joined to the semiconductor strip is provided. A first dielectric layer and a second dielectric layer are disposed on opposite sidewalls of the semiconductor strip. The integrated circuit device further includes a first conductive liner and a second conductive liner, wherein the semiconductor strip, the first dielectric layer, and the second dielectric layer are between the first conductive liner and the second conductive line. The first conductive liner and the second conductive liner are between, and in contact with, sidewalls of a first portion and a second portion of the isolation regions.

20 Claims, 18 Drawing Sheets

(56) References Cited

U.S. PATENT DOCUMENTS

2010/0270619 A1 10/2010 Lee

* cited by examiner

FORMING CONDUCTIVE STI LINERS FOR FINFETS

This is a divisional application of U.S. patent application Ser. No. 14/052,328, filed on Oct. 11, 2013, entitled "Forming Conductive STI Liners for FinFETs," which application is incorporated herein in its entirety.

BACKGROUND

A Fin Field-Effect Transistor (FinFET) often includes a semiconductor fin, on which a gate dielectric and a gate electrode are formed. The gate dielectric and the gate electrode are formed on the sidewalls and the top surface of the semiconductor fin. The channel region of the FinFET thus includes a top surface portion and sidewall portions of the semiconductor fin.

Typically, the formation of the semiconductor fin includes forming Shallow Trench Isolation (STI) regions extending into a semiconductor substrate, with a portion (referred to as semiconductor strip hereinafter) of the semiconductor substrate being located between opposite sidewalls of the STI regions. The STI regions are then recessed, so that a top portion of the semiconductor strip forms a fin that protrudes above the top surfaces of the remaining STI regions. The conduction of the semiconductor fin is controlled by the gate electrode. The bottom portion of the semiconductor strip, however, is not controlled by the gate electrode, and leakage current occurs in this region when the respective FinFET is turned off.

Conventionally, to reduce the leakage current, an anti-punch-through implantation is performed to implant an impurity into the portion of the semiconductor strip that is lower than the top surfaces of the STI regions, hence forming an anti-punch-through region. The implanted impurity has a conductivity type opposite to the conductivity type of the source and drain regions of the FinFET. The anti-punch-through region has a high doping concentration, and hence has reduced carrier mobility than if the anti-punch-through region is not formed. The reduced carrier mobility results in the reduction in the leakage current.

Due to the high doping concentration in the anti-punch-through region, however, the risk of incurring Random Dopant Fluctuation (RDF) is increased. The risk is further worsened in recent generations of integrated circuits, in which the semiconductor fins and the underlying semiconductor strips become very thin, and hence the concentration of dopants in the anti-punch-through regions is increased. This results in the RDF variability problem to be more severe. In addition, the high doping concentration at the bottom of the fins results in the increase in the body effect, which degrades the sub-threshold slope of the resulting FinFETs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and the methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Figure 1:
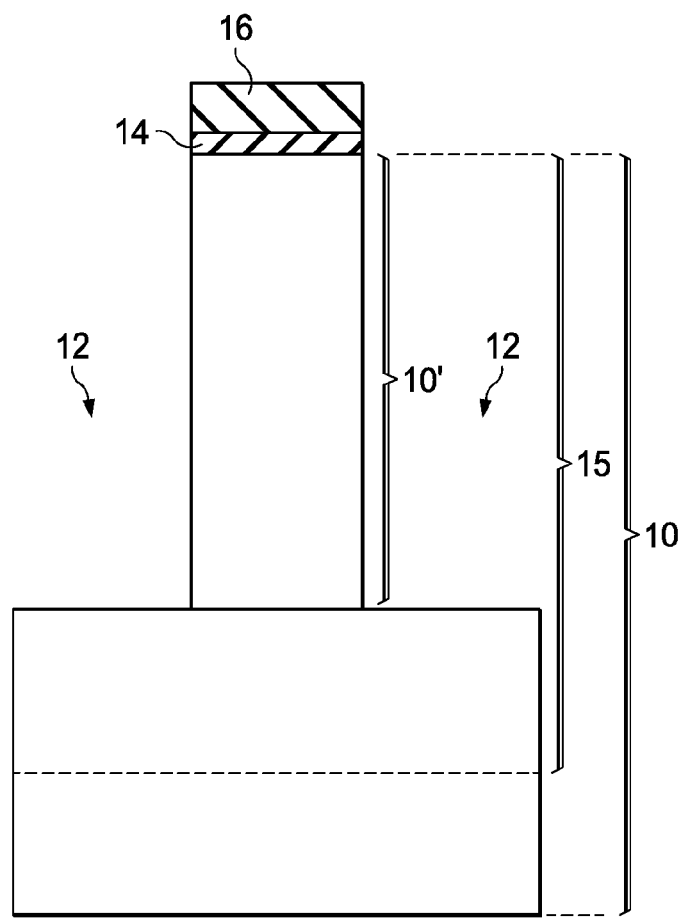
FIGS. 1 through 7 are cross-sectional views of intermediate stages in the formation of a Fin Field-Effect Transistor (FinFET) in accordance with some exemplary embodiments, wherein a conductive liner is formed.

Referring to FIG. 1, substrate 10 is provided. Substrate 10 may be a semiconductor substrate such as a crystalline silicon substrate, a silicon germanium substrate, a silicon carbon substrate, a III-V compound semiconductor substrate, or the like. Well region 15 is formed in semiconductor substrate 10. The conductivity type of well region 15 is opposite to the conductivity type of the source/drain regions 38 of the FinFET 40 (FIGS. 7, 10, 15, and 16), which is to be formed in subsequent processes. For example, if the resulting FinFET 40 is an n-type FinFET, well region 15 is a p-well region. Conversely, if the resulting FinFET 40 is a p-type FinFET, well region 15 is an n-well region.

Semiconductor substrate 10 is etched to form trenches 12, which extend from the top surface of semiconductor substrate 10 into semiconductor substrate 10. The portion of semiconductor substrate 10 between neighboring trenches 12 is referred to as semiconductor strip 10' hereinafter. Hard mask 16 may be formed to define the patterns of trenches 12 and semiconductor strip 10', wherein semiconductor substrate 10 is etched using hard mask 16 as an etching mask. Hard mask 16 may comprise, for example, silicon nitride. In some exemplary embodiments, pad layer 14 is formed between hard mask 16 and semiconductor substrate 10. In the embodiments in which semiconductor substrate 10 is a silicon substrate, pad layer 14 may include silicon oxide, which may be formed through thermal oxidation of semiconductor substrate 10.

Trenches 12 include portions on the opposite sides of semiconductor strip 10'. The neighboring portions on the opposite sides of semiconductor strip 10' may be physically disconnected from each other, or may be portions of a continuous trench that forms a trench ring encircling semiconductor strip 10' in some embodiments.

Figure 2:
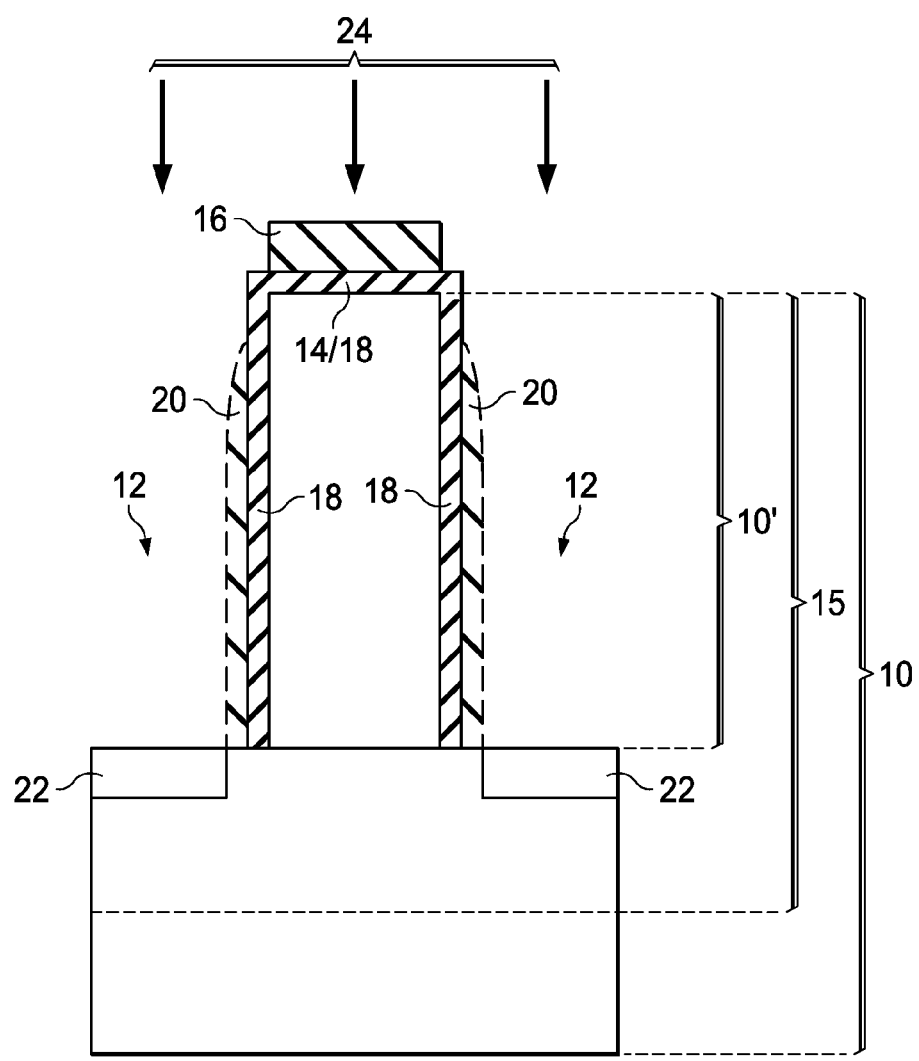

Next, referring to FIG. 2, dielectric layer 18 is formed on the sidewalls of semiconductor strip 10'. In some embodiments, dielectric layer 18 is formed through the thermally oxidizing a surface layer of semiconductor strip 10', then removing the horizontal portions of the resulting thermal oxide layer. The vertical portions of the semiconductor strip 10' left on the sidewalls of semiconductor strip 10' form dielectric layer 18. In alternative embodiments, dielectric layer 18 is formed by depositing a conformal dielectric layer on semiconductor strip 10', and then removing the horizontal portions of the dielectric layer. Dielectric layer 18 may be formed of silicon oxide, silicon carbide, silicon oxynitride, or other dielectric materials. In FIG. 2, pad layer 14 and dielectric layer 18 are marked together since pad layer 14 (FIG. 1) may be formed of a same dielectric material (such as silicon oxide) as dielectric layer 18.

Next, implantation 24 is performed to form doped semiconductor regions 22 in well region 15. In some embodiments, doped semiconductor regions 22 are heavily doped to have an impurity concentration between about $10^{19}/cm^3$ and about $10^{21}/cm^3$, although doped semiconductor regions 22 may have higher or lower impurity concentrations. The conductivity type of doped semiconductor regions 22 is the same as that of well region 15. Implantation 24 may be performed using hard mask 16 and dielectric layer 18 as an implantation mask. Additional spacers 20 may be, or may not be, formed before the implantation, wherein spacers 20 are used to adjust the positions of doped semiconductor regions 22.

Figure 3:
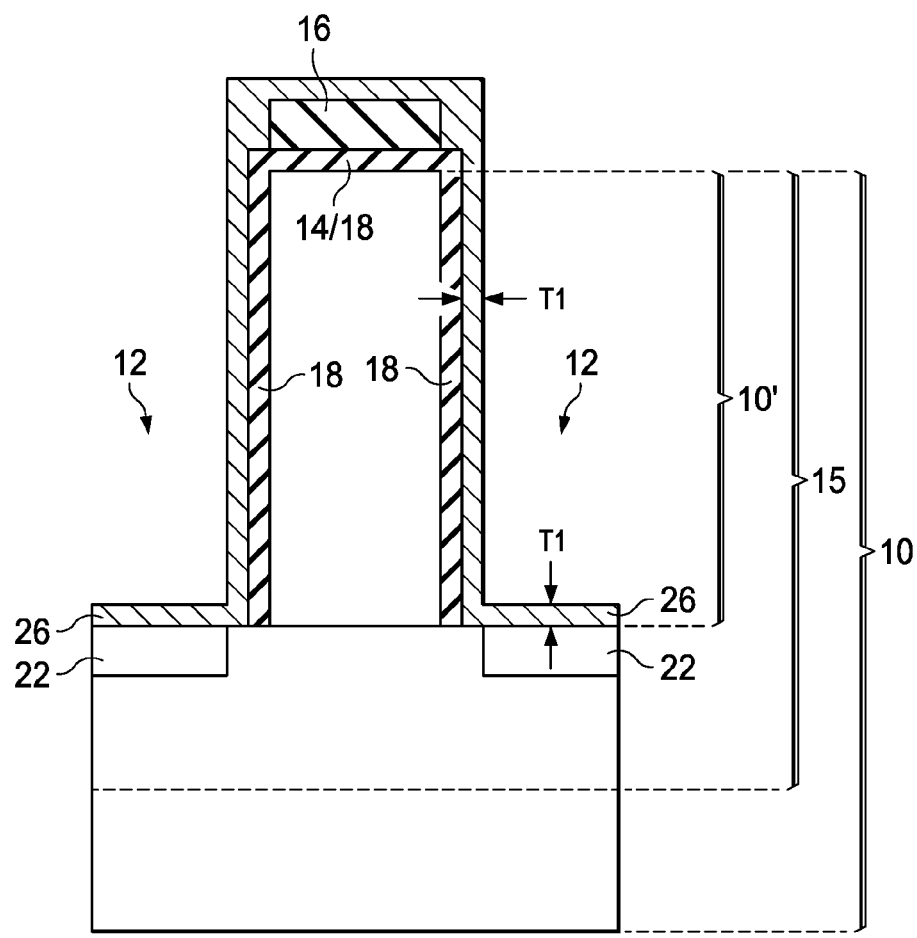

FIG. 3 illustrates the formation of conductive layer 26, which may be formed as a conformal layer including vertical portions and horizontal portions that have similar thicknesses T1. In some embodiments, conductive layer 26 comprises polysilicon, which is doped to a same conductivity type as that of doped semiconductor regions 22. In which embodiments, the polysilicon is heavily doped, for example, to an impurity concentration between about $10^{19}/cm^3$ and about $10^{21}/cm^3$, although higher or lower impurity concentrations may be used. For example, if an n-type FinFET is to be formed, conductive layer 26 are p+ regions, and if a p-type FinFET is to be formed, conductive layer 26 are n+ regions. The dopant/impurity in conductive layer 26 may be added in-situ with the proceeding of the deposition of conductive layer 26. Alternatively, conductive layer 26 may be formed of a mid-gap metal having a band-gap in the range between about 4.3 eV and about 4.9 eV. The available metals include, and are not limited to, Titanium nitride (TiN), Tantalum nitride (TaN), Tanalum carbide (TaC), and alloys of the above-mentioned metals. If a mid-gap metal is used to form conductive layer 26, the conductive layer 26 for p-type FinFETs and n-type FinFETs on the same wafer may be formed simultaneously. The manufacturing cost is hence saved. If polysilicon is used to form conductive layer 26, the conductive layer 26 of n-type FinFETs and the conductive layer 26 of p-type FinFETs may be formed separated. Conductive layer 26 may have thicknesses T1 in the range between about 1 nm and about 10 nm, although different thicknesses may be used. Conductive layer 26 is in contact with, and may form Ohmic contacts with, doped semiconductor regions 22. In some embodiments, conductive layer 26 are patterned, so that the portions of conductive layer 26 close to semiconductor strip 10' are left, and the remaining portions are removed.

Figure 4:
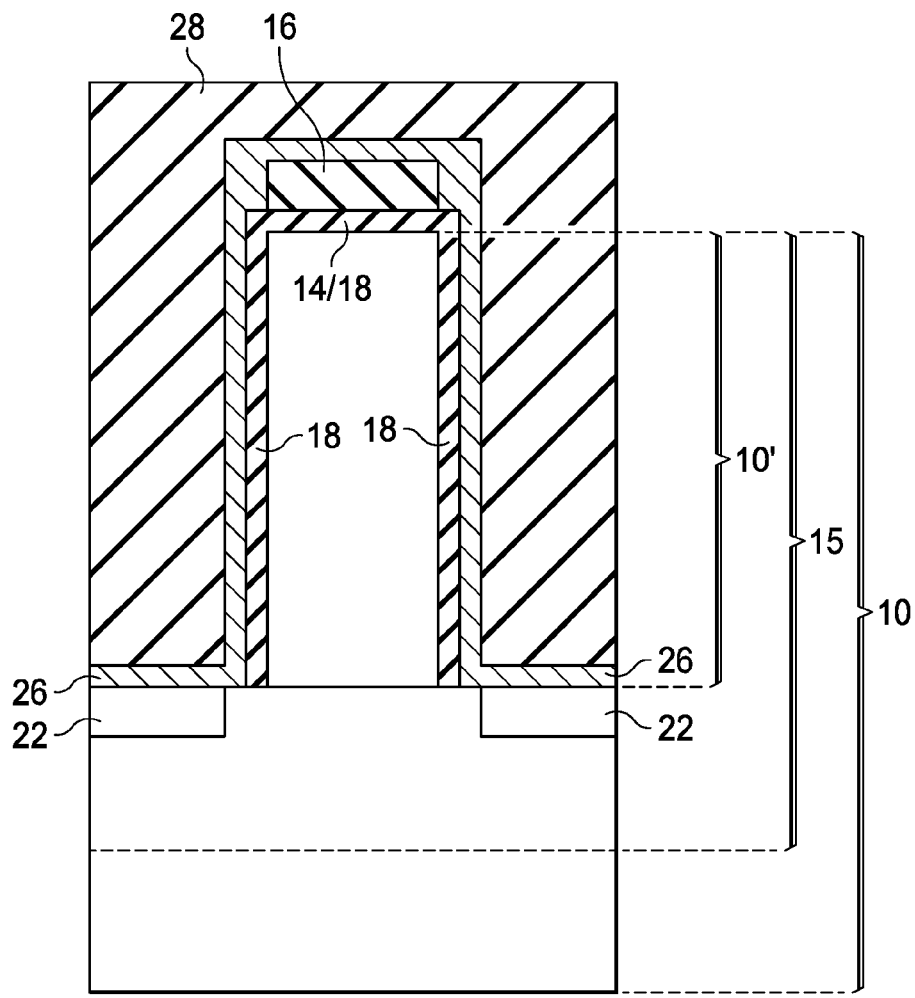
Figure 5:
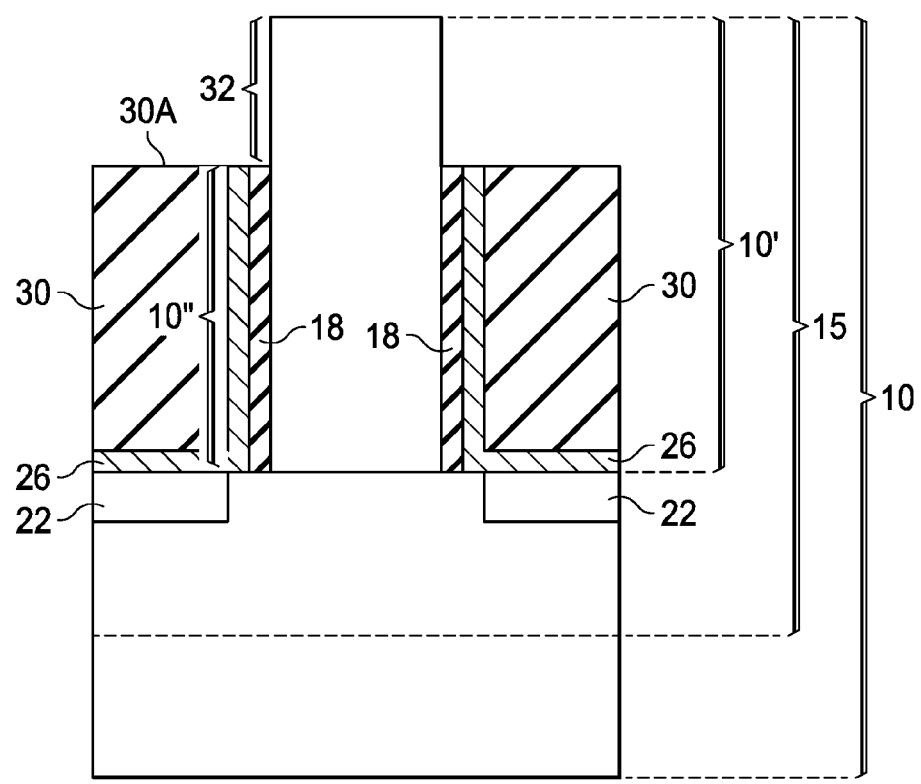

FIG. 4 illustrates the formation of dielectric material 28, which fills trenches 12 in FIG. 3. In some embodiments, dielectric material 28 includes an oxide formed using Flowable Chemical Vapor Deposition (FCVD), which oxide may include silicon oxide. In alternative embodiments, other deposition methods such as High Density Plasma Chemical Vapor Deposition (HDPCVD) may be used to form dielectric material 28. Next, dielectric material 28 is leveled, for example, through a Chemical Mechanical Polish (CMP), with hard mask layer 16 used as a CMP stop layer. The remaining portions of dielectric material 28 form Shallow Trench Isolation (STI) regions 30, as shown in FIG. 5. Conductive layer 26 acts as the liners of STI regions 30, and hence is referred to as STI liners 26 hereinafter.

FIG. 5 also illustrates the recessing of STI regions 30 and STI liners 26, and the removal of hard mask 16 and pad layer 14 (FIG. 14), and the top portion of dielectric layer 18. For example, STI regions 30 and STI liners 26 may be first recessed through etching. The exposed sidewalls portions of dielectric layer 18 are also removed. Next, hard mask layer 16 and the remaining portions of pad layer 14 are removed. The top portion of semiconductor strip 10' above the top surfaces 30A of STI regions 30 are referred to as semiconductor fin 32 throughout the description, and the lower portion of the semiconductor substrate 10' is referred to as semiconductor strip 10''.

Figure 6:
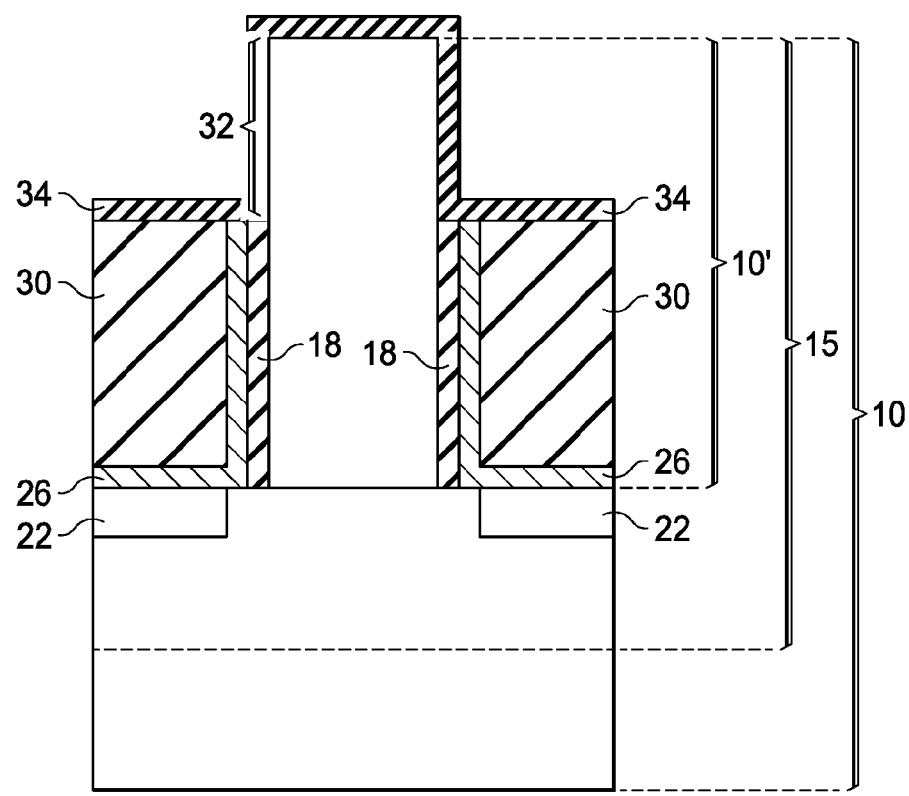

FIG. 6 illustrates the formation of gate dielectric 34. Gate dielectric 34 may be formed of a dielectric material such as silicon oxide, silicon nitride, an oxynitride, multi-layers thereof, and/or combinations thereof. Gate dielectric 34 may also be formed of high-k dielectric materials. The exemplary high-k materials may have k values higher than about 4.0, or higher than about 7.0. The exemplary materials include hafnium oxide, zirconium oxide, and the like.

Figure 7:
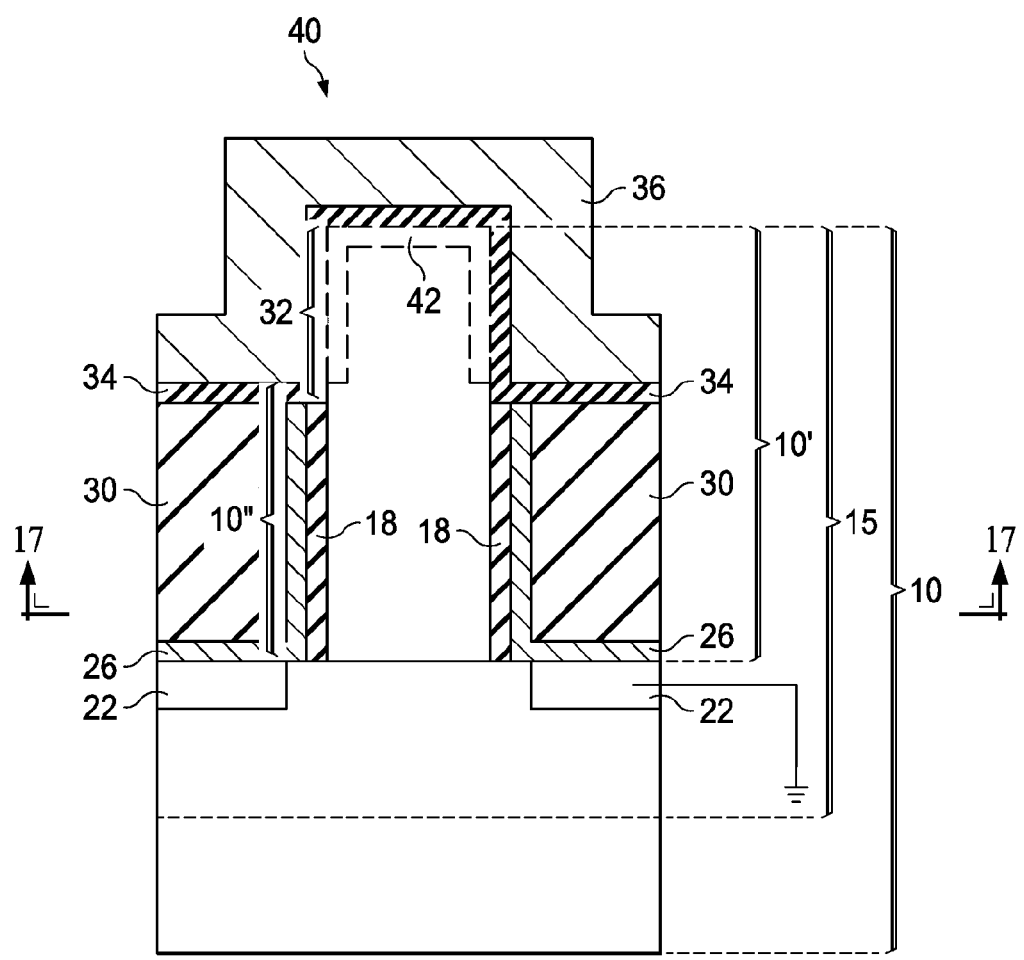

Next, referring to FIG. 7, gate electrode 36 is formed over gate dielectric 34. Gate electrode 36 may be formed of a conductive material selected from doped polysilicon, metals, metal nitrides, metal silicides, and the like. After the formation of gate dielectric 34 and gate electrode 36, source and drain regions 38 (not in the illustrated plane, referring to FIG. 17) are formed. The resulting FinFET comprising gate dielectric 34, gate electrode 36, and source and drain regions 38 is referred to as FinFET 40.

In FinFET 40, channel 42 is formed in semiconductor fin 32, which channel is controlled by gate electrode 36, so that channel 42 can be turned on and off. Semiconductor strip portion 10'' is not controllable by gate electrode 36, and hence may have leakage current flowing through when FinFET 40 is turned off. In the embodiments of the present disclosure, STI liners 26 are electrically connected to doped semiconductor regions 22, which further electrically connect STI liners 26 to well region 15. Well region 15 may be electrically grounded, and hence STI liners 26 are also electrically grounded. The grounded STI liners 26 function to reduce the leakage currents flowing through semiconductor strip portion 10''. Hence, in accordance with the embodiments of the present disclosure, no anti-punch through implantation (as performed in conventional FinFETs) is needed, which anti-punch through implantation, if performed, would have implanted the impurity that is of the same conductivity type as the respective well region 15 into semiconductor strip portion 10'' to reduce leakage currents.

Figure 8:
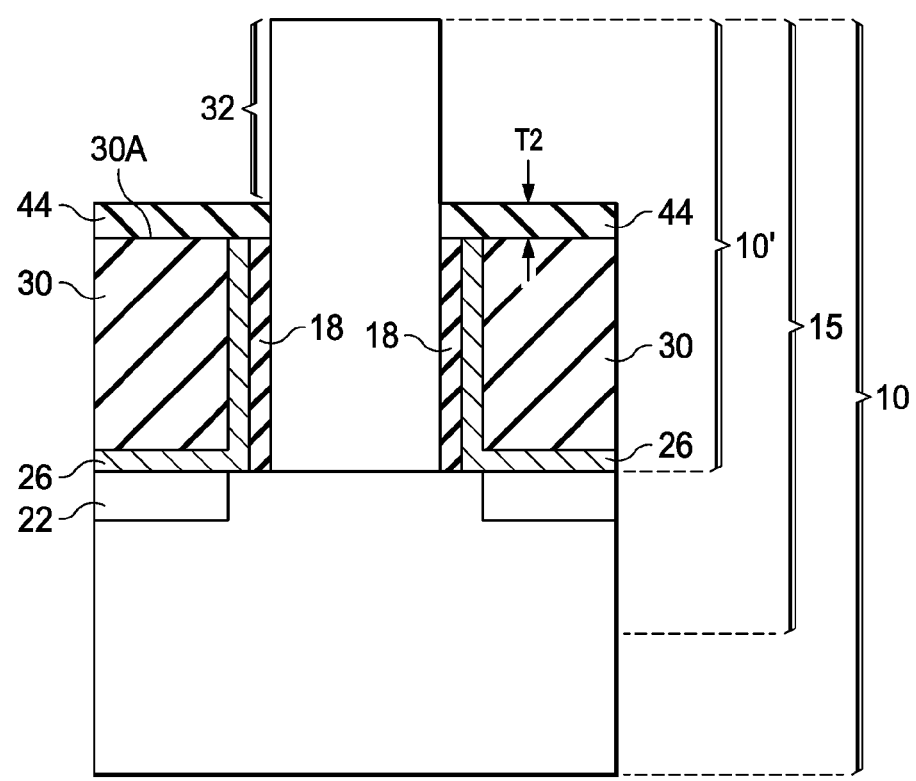
FIGS. 8 through 10 are cross-sectional views of intermediate stages in the formation of a FinFET in accordance with some exemplary embodiments, wherein a dielectric layer is formed to space a conductive liner further away from an overlying gate electrode.
Figure 9:
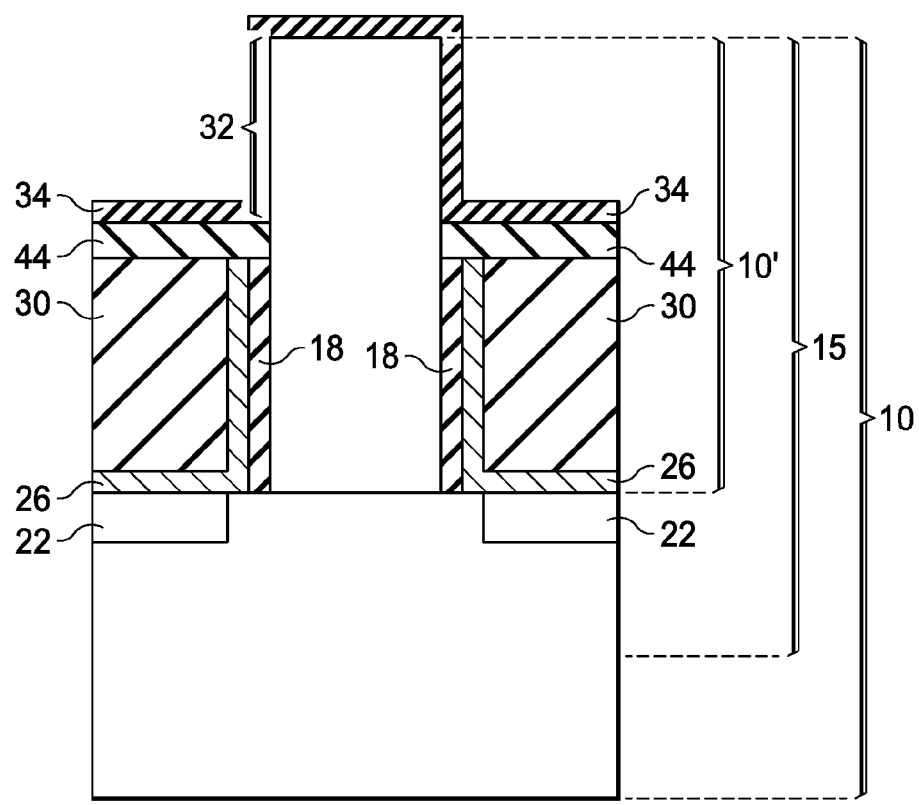
Figure 10:
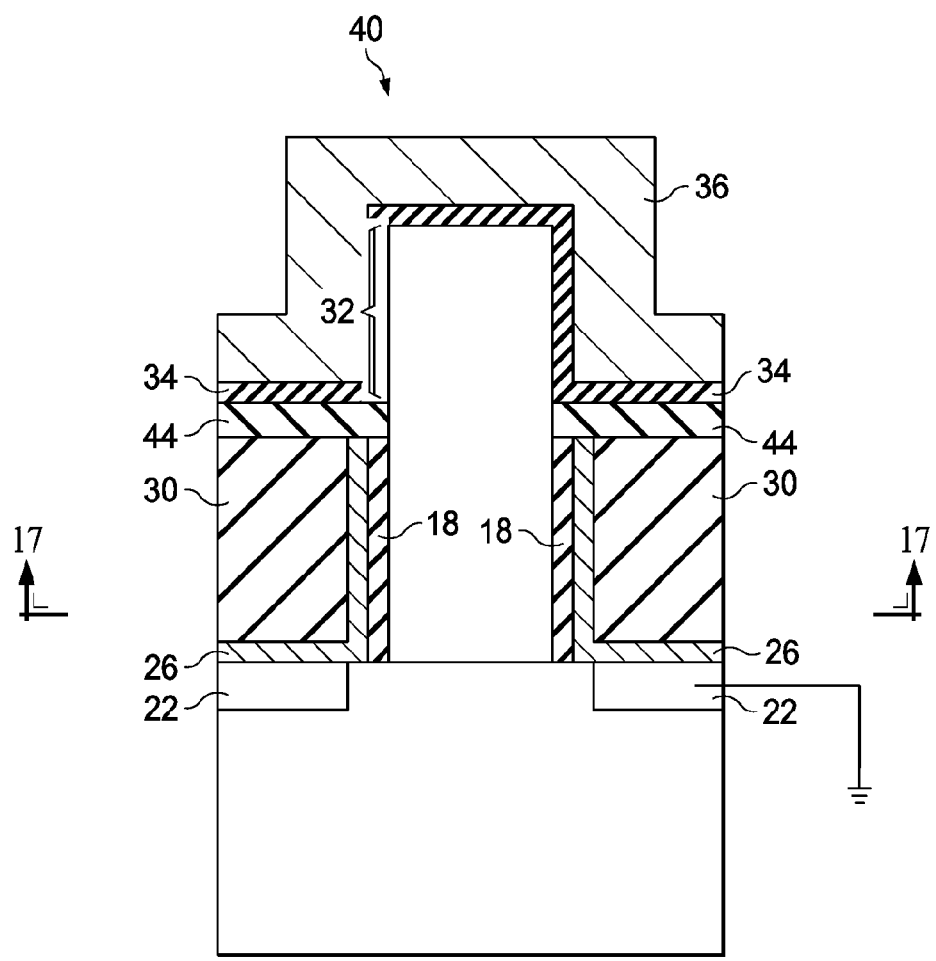
Figure 11:
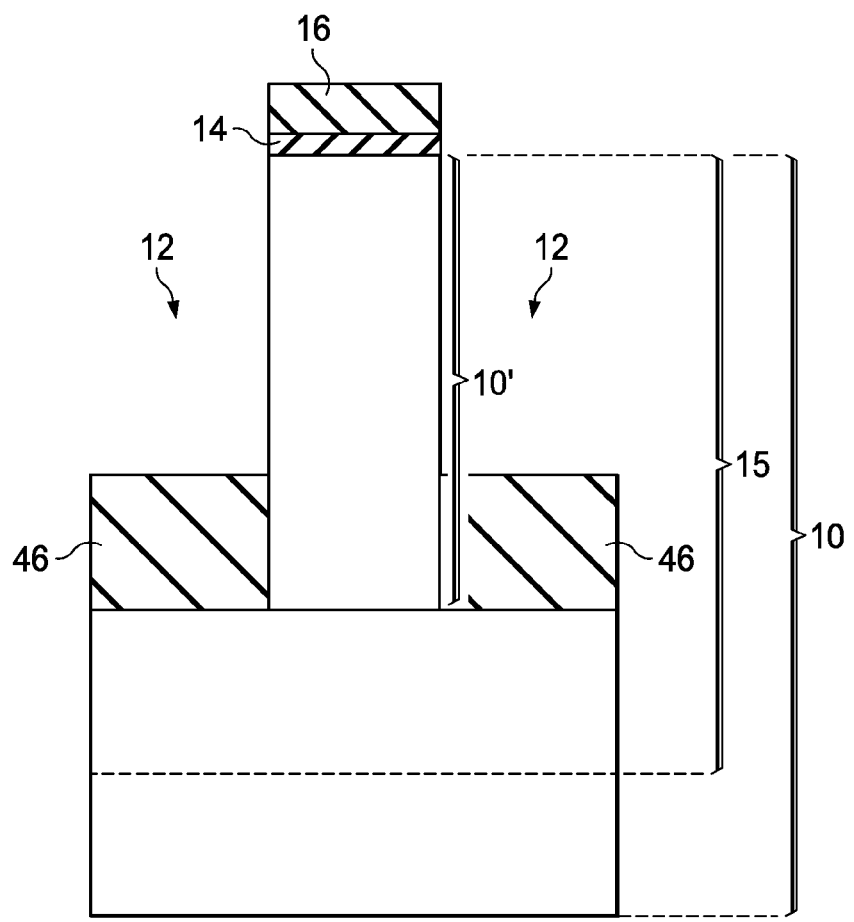
FIGS. 11 through 15 are cross-sectional views of intermediate stages in the formation of a FinFET in accordance with some exemplary embodiments, wherein a conductive liner is electrically de-coupled from the respective semiconductor substrate.

FIGS. 8 through 10 illustrate the cross-sectional views of intermediate stages in the formation of FinFETs in accordance with alternative embodiments. Unless specified otherwise, the materials and the formation methods of the components in these embodiments are essentially the same as the like components, which are denoted by like reference numerals in the embodiments shown in FIGS. 1 through 7.

The details regarding the formation process and the materials of the components shown in FIGS. 8 through 10 may thus be found in the discussion of the embodiment shown in FIGS. 1 through 7.

The initial steps of the embodiments in FIGS. 8 through 10 are essentially the same as shown in FIGS. 1 through 4. Next, after the recessing of STI regions 30 to form semiconductor fin 32, dielectric layer 44 is formed over STI regions 30, as shown in FIG. 8. In some embodiments, dielectric layer 44 comprises silicon oxide, silicon nitride, or other dielectric materials. In the top view of the structure as shown in FIG. 8, dielectric layer 44 may form a ring encircling, and in contact with the sidewalls of, the top portion of semiconductor strip 10'. Thickness T2 of dielectric layer 44 may be greater than about 1 nm, for example. In some exemplary embodiments, dielectric layer 44 is formed by filling a dielectric material over STI regions 30, performing a CMP to planarize the dielectric material, and etching back the dielectric material. Next, as shown in FIGS. 9 and 10, gate dielectric 34 and gate electrode 36 are formed to finish the formation of FinFET 40. Source/drain regions 38 (FIG. 17) are also formed.

In these embodiments, dielectric layer 44 separates gate electrode 36 farther away from conductive liners 26 than if dielectric layer 44 is not formed. This results in the increase in the breakdown voltage between gate electrode 36 and conductive liners 26.

FIGS. 11 through 15 illustrate the formation of FinFET 40 in accordance with yet alternative embodiments. These embodiments are similar to the FinFET in FIG. 7, except conductive liners 26 (FIG. 15) are electrically decoupled from well region 15, and hence conductive liners 26 may be biased with a voltage different from the voltage of well region 15. The brief formation steps are discussed as follows.

The initial process step and the structure are essentially the same as shown in FIG. 1. Next, referring to FIG. 11, dielectric layer 46 is formed in recesses 12. Dielectric layer 46 covers the bottoms of recesses 12, while leaving the sidewalls of semiconductor strip 10' not covered. In some embodiments, dielectric layer 46 comprises silicon oxide, silicon nitride, or other dielectric materials. In the top view of the structure in FIG. 11, dielectric layer 46 may form a ring encircling, and in contact with, the bottom portion of semiconductor substrate 10'. In some exemplary embodiments, dielectric layer 46 is formed by filling a dielectric material in recesses 12, performing a CMP to planarize the top surface of the dielectric material (for example, using hard mask 16 as a CMP stop layer), and recessing the dielectric material through etching back.

Figure 12:
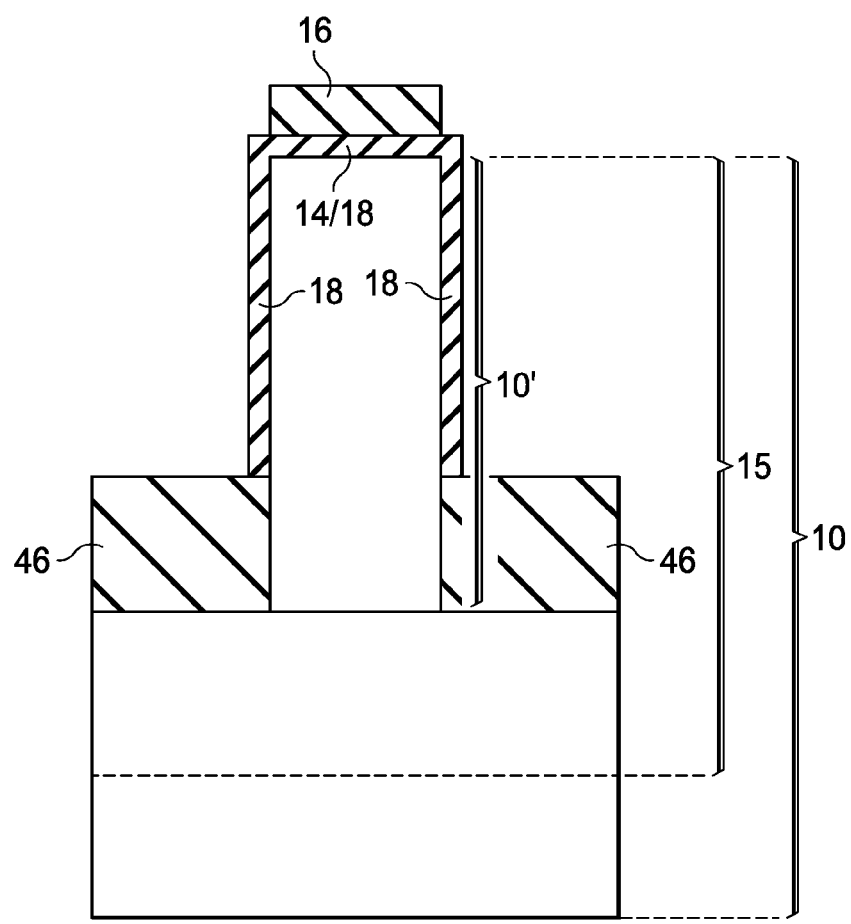
Figure 13:
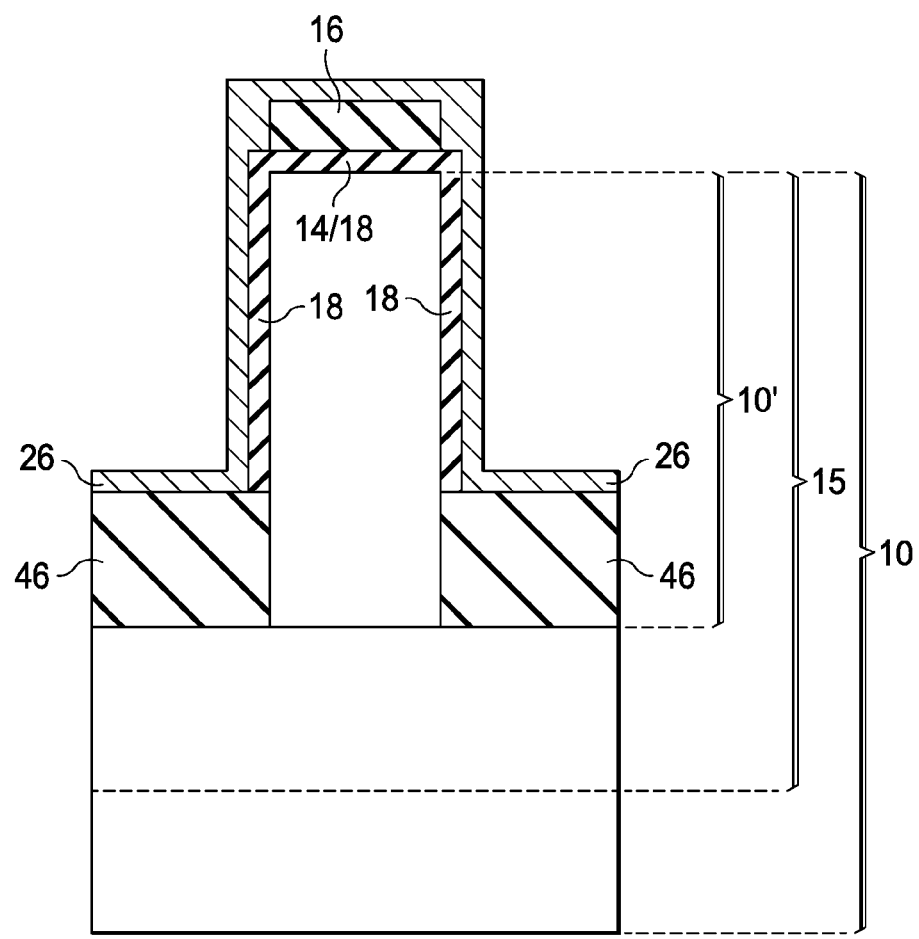
Figure 14:
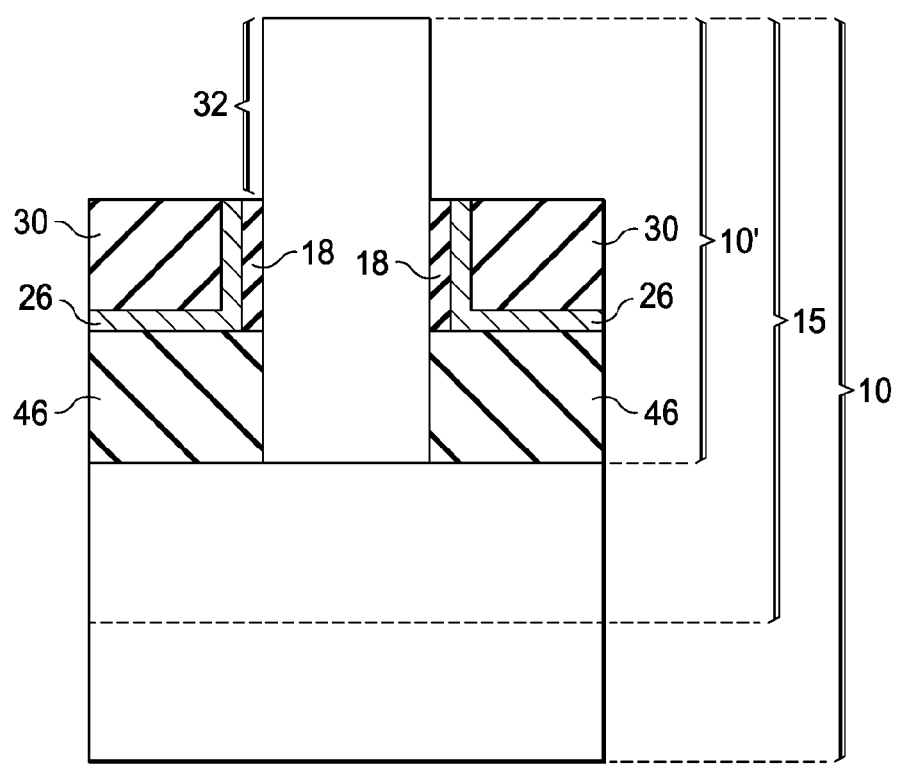

The subsequent steps shown in FIGS. 12 through 15 are similar to the process steps shown in FIGS. 3 through 7. A brief process is discussed as follows. Referring to FIG. 12, dielectric layer 18 is formed on the sidewalls of semiconductor strip 10'. In these embodiments, the horizontal portions (although not shown) of dielectric layer 18 may be left un-removed. Next, as shown in FIG. 13, STI liner 26 is formed on dielectric layer 18. STI regions 30 are then formed, followed by the recessing of STI liner 26 and STI regions 30. The resulting structure is shown in FIG. 14. Semiconductor fin 32 is thus formed.

Figure 15:
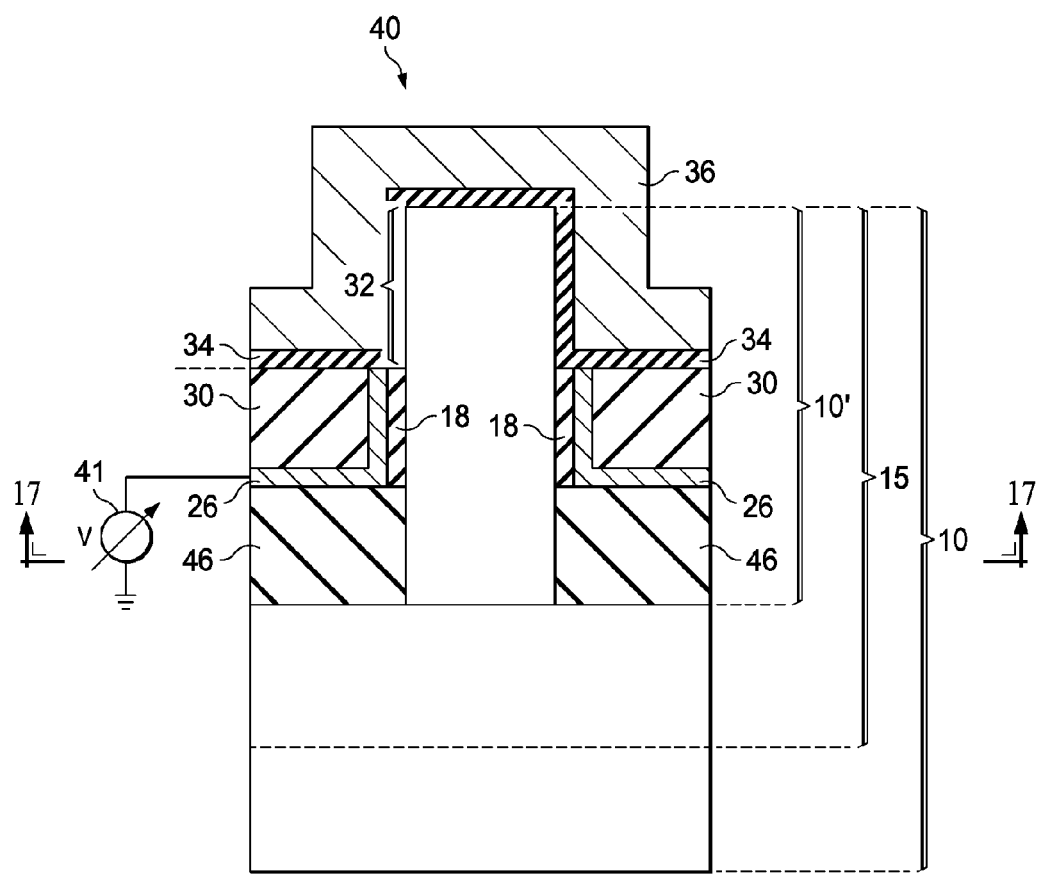

FIG. 15 illustrates the formation of gate dielectric 34 and gate electrode 36 for FinFET 40. The formation may be essentially the same as in FIGS. 6 and 7, and hence the formation details are not repeated herein. Source/drain regions 38 (FIG. 17) are also formed. In the resulting FinFET 40, since conductive liners 26 are electrically decoupled from well region 15, a bias voltage source 41 is connected to conductive liner 26. Bias voltage source 41 is configured to provide bias voltage V to conductive liners 26. Through the application of bias voltage V, the threshold voltage of FinFET 40 may be adjusted. For example, for n-type FinFET 40, applying a negative voltage (for example, in the range between about 0 Volts and about −3 Volts) may cause the increase in the threshold voltage of FinFET 40. Conversely, applying a positive voltage (for example, in the range between about 0 Volts and about +3 Volts) may cause the decrease in the threshold voltage of FinFET 40.

Figure 16:
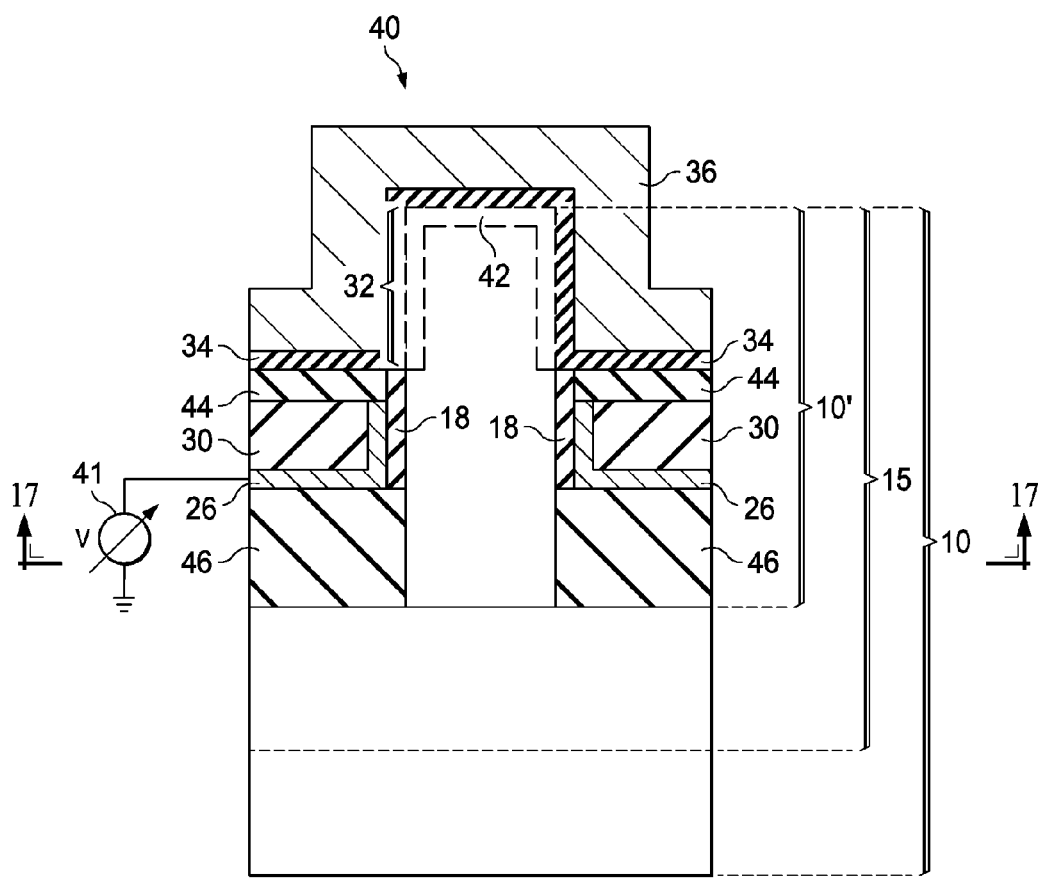
FIG. 16 illustrates a cross-sectional view of a FinFET in accordance with some exemplary embodiments, wherein a conductive liner is electrically de-coupled from the respective semiconductor substrate, and wherein a dielectric layer is formed to space a conductive liner further away from an overlying gate electrode.

FIG. 16 illustrates FinFET 40 in accordance with yet alternative embodiments. FinFET 40 in accordance with these embodiments is similar to what is shown in FIG. 15, except that dielectric layer 44 is formed over conductive liners 26 and STI regions 30. Dielectric layer 44 is underlying gate dielectric 34. The formation process in these embodiments is essentially the same as in the embodiments shown in FIGS. 11 through 15, except that some process steps are inserted between the step in FIG. 14 and the step in FIG. 15 to form dielectric layer 44. The formation of dielectric layer 44 may be found in the process step discussed referring to FIG. 8. In the top view of the structure in FIG. 16, each of STI regions 30, conductive liners 26, dielectric layers 18, and dielectric layers 44 and 46 may form a ring encircling semiconductor substrate 10'. Again, in these embodiments, bias voltage V may be adjusted through voltage source 41. Furthermore, the formation of dielectric layer 44 results in the increase in the breakdown voltage between gate electrode 36 and conductive liners 26.

Figure 17:
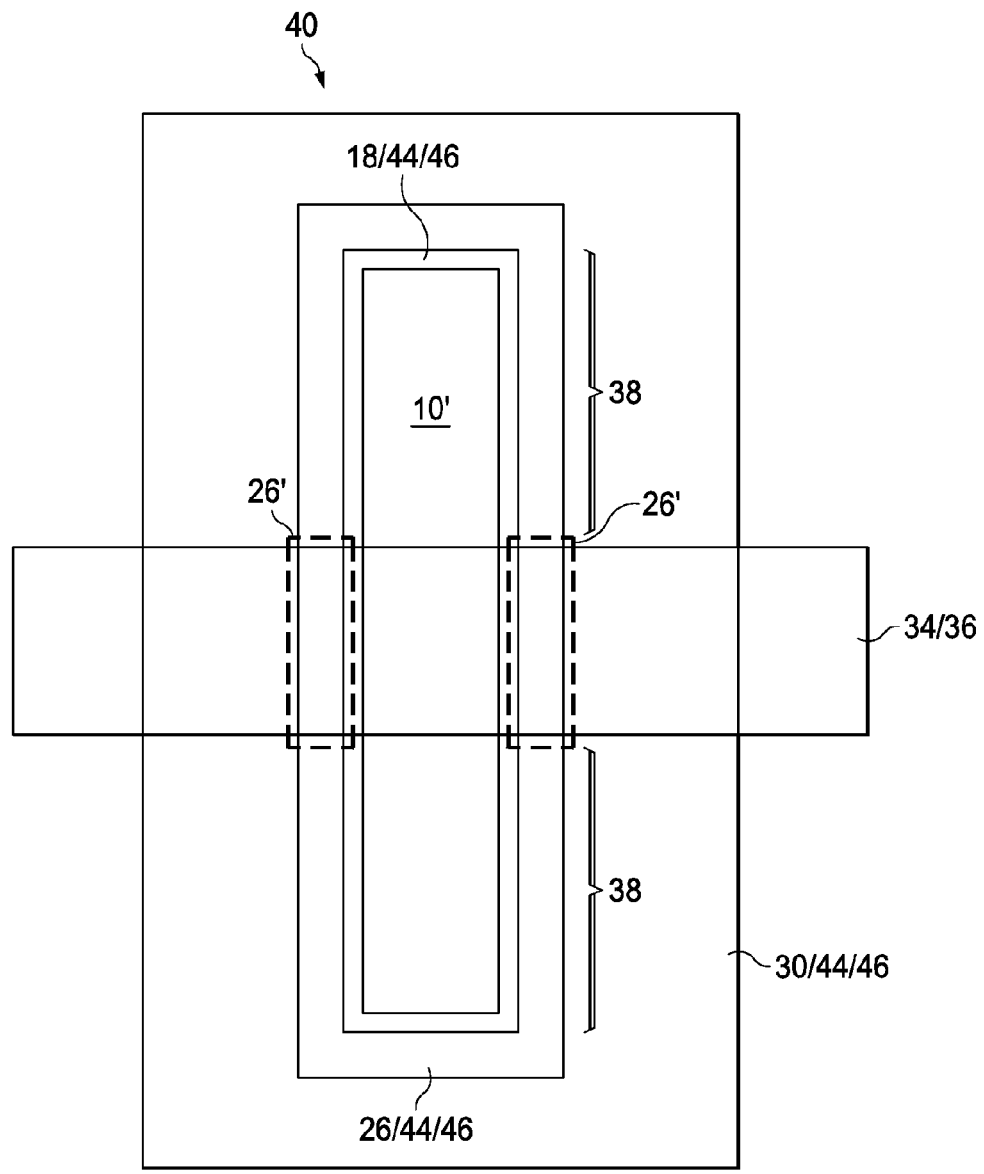
FIG. 17 illustrates a top view of some exemplary FinFETs.

FIG. 17 illustrates a top view of conductive liner 26 and semiconductor strip 10'. The top view shown in FIG. 17 may be obtained from the FinFET 40 shown in FIGS. 7, 10, 15, and 16. As shown in FIG. 17, conductive liner 26 may form a ring encircling semiconductor strip 10'. Portions 26' of conductive liner 26 are the active parts that reduce leakage currents. Furthermore, the portions of conductive liner 26 functions to reduce the leakage currents and/or adjusting threshold voltage. Conductive liner 26 further includes portions on the sidewalls of the portions of semiconductor strip 10' overlapped by source and drain regions 38.

Figure 18:
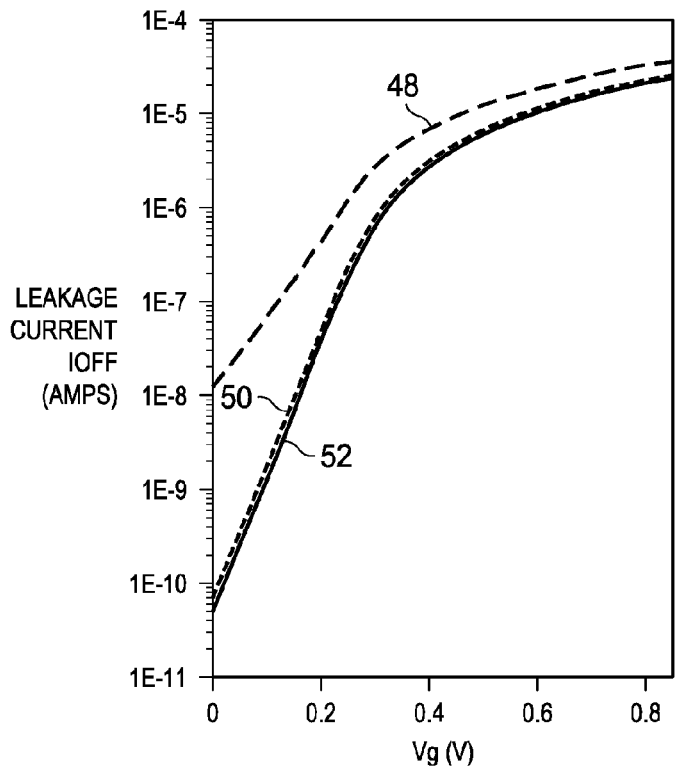
FIGS. 18 and 19 illustrate simulation results, wherein leakage currents of the simulated FinFETs are illustrated as a function of gate voltages.

FIG. 18 illustrates the simulation results of various simulated FinFETs, wherein leakage currents Ioff of the simulated FinFETs are illustrated as a function of gate voltage Vg. Line 48 is obtained from a FinFET that does not include conductive liners, and does not have anti-punch-through implantations. The respective leakage current (when gate voltage Vg is equal to zero volts) is higher than about $10^{-8}$ amps. The sub-threshold swing of line 48 is about 122 mV/dec. Line 50 is obtained from a FinFET that has polysilicon liners, with the polysilicon liners being heavily doped. The respective leakage current is lower than $10^{-10}$ amps, which is equal to about 3 percent of the leakage current obtained from line 48. The sub-threshold swing of the FinFET corresponding to line 50 is about 78 mV/dec, which is significantly improved over the sub-threshold swing represented by line 48. Line 52 is obtained from a FinFET that has a mid-gap meta as the conductive liners. Lines 50 and 52 reveal that the respective simulated FinFETs have similar performance. The leakage current of the FinFET represented by line 52 is also lower than $10^{-10}$ amps, which is about 3 percent of the leakage current obtained from line 48. The sub-threshold swing of the FinFET of line 52 is about 77 mV/dec, which is significantly improved over the sub-threshold swing of the FinFET represented by line 48. Therefore, the FinFETs (corresponding to lines 50 and 52) formed in accordance with the embodiments of the present disclosure has lower leakage currents than the conventional FinFETs (corresponding to line 48) without anti-punch-through regions being performed. This indicates that the conductive lines in accordance with the embodiments have the effect of reducing leakage currents.

Figure 19:
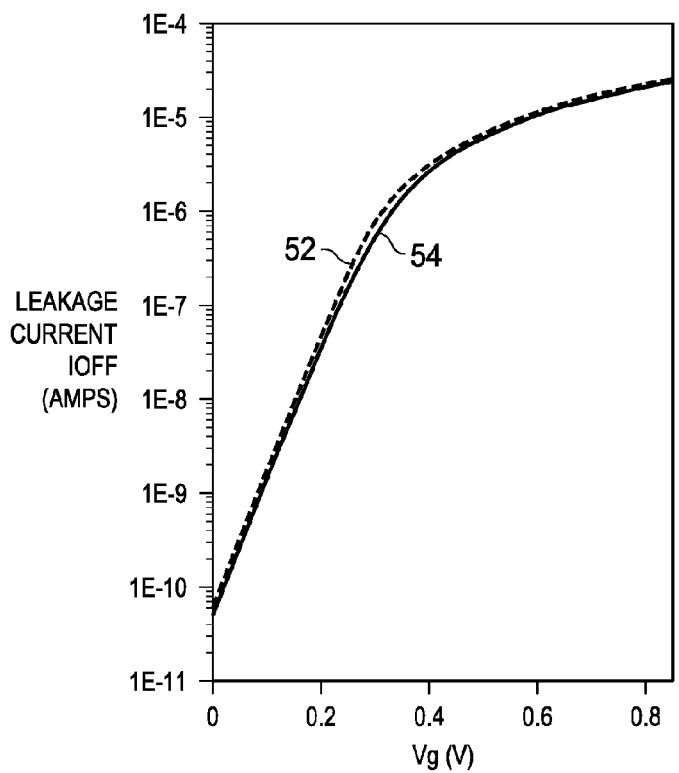

FIG. 19 also illustrates the simulation results of various simulated FinFETs, wherein leakage currents Ioff are illustrated as a function of gate voltage Vg. Line 52 is the same as in FIG. 18. Line 54 is simulated from a conventional FinFET that has anti-punch-through implantation formed, with the doping concentration in the anti-punch-through being $5 \times 10^{18}/cm^3$. As shown by line 54, the leakage current (of the FinFET of line 54) when gate voltage Vg is equal to zero volts is similar to the FinFET of line 52. The sub-threshold swing of line 54, however, is about 84 mV/dec, which is inferior to the 77 mV/dec obtained from line 52. Therefore, the FinFETs (corresponding to line 52) formed in accordance with the embodiments of the present disclosure have better sub-threshold swing than the FinFETs (corresponding to line 54) with anti-punch-through implantation.

In accordance with some embodiments, an integrated circuit device includes a semiconductor substrate, isolation regions extending into the semiconductor substrate, a semiconductor strip, and a semiconductor fin overlapping and joined to the semiconductor strip. A first dielectric layer and a second dielectric layer are disposed on opposite sidewalls of the semiconductor strip. The integrated circuit device further includes a first conductive liner and a second conductive liner, wherein the semiconductor strip, the first dielectric layer, and the second dielectric layer are between the first conductive liner and the second conductive line. The first conductive liner and the second conductive liner are between, and in contact with, sidewalls of a first portion and a second portion of the isolation regions.

In accordance with other embodiments, an integrated circuit device includes a semiconductor substrate, isolation regions extending into the semiconductor substrate, a semiconductor strip between portions of the isolation regions, and a semiconductor fin overlapping and joined to the semiconductor strip. A dielectric layer forms a first ring encircling a portion of the semiconductor strip. A conductive liner forms a second ring encircling the first ring. A gate dielectric is on sidewalls and a top surface of the semiconductor fin. A gate electrode is overlying the gate dielectric. The gate electrode and the gate dielectric overlap the first ring and a portion of the second ring.

In accordance with yet other embodiments, a method includes etching a semiconductor substrate to form a recess in the semiconductor substrate. An un-recessed portion of the semiconductor substrate between opposite portions of the recess forms a semiconductor strip. The method further includes forming a first dielectric layer on sidewalls of the semiconductor strip, forming a conductive liner on sidewalls of the first dielectric layer, filling the recess to form an isolation region, and recessing the conductive liner and the isolation region. A portion of the semiconductor strip forms a semiconductor fin over a remaining portion of the isolation region. A gate dielectric is formed on sidewalls and a top surface of the semiconductor fin. A gate electrode is overlying the gate dielectric, wherein the gate electrode and the gate dielectric overlap the conductive liner. The gate dielectric and the gate electrode form parts of a FinFET.

In accordance with yet another embodiment, a method of forming a semiconductor device is provided. The method includes forming a first dielectric layer along sidewalls of a fin extending from a substrate, forming a conductive layer over the first dielectric layer, and forming a second dielectric layer over the conductive layer. The first dielectric layer, the conductive layer, and the second dielectric layer is recessed, thereby exposing an upper portion of the fin. The method further includes forming a gate dielectric over the upper portion of the fin and forming a gate electrode over the gate dielectric.

In accordance with yet another embodiment, a method of forming a semiconductor device is provided. The method includes etching a semiconductor substrate to form a recess in the semiconductor substrate, wherein an un-recessed portion of the semiconductor substrate between opposite portions of the recess forms a semiconductor strip, forming a first dielectric layer on sidewalls of the semiconductor strip, and forming a conductive liner on sidewalls of the first dielectric layer. The recess is filled to form an isolation region, and the conductive liner and the isolation region is recessed, wherein a portion of the semiconductor strip forms a semiconductor fin over a remaining portion of the isolation region. The method further includes forming a gate dielectric on sidewalls and a top surface of the semiconductor fin, and forming a gate electrode overlying the gate dielectric, wherein the gate electrode and the gate dielectric overlap the conductive liner, and wherein the gate dielectric and the gate electrode form parts of a Fin Field-Effect Transistor (FinFET).

In accordance with yet another embodiment, a method of forming a semiconductor device is provided. The method includes forming a fin extending from a substrate, forming an "L" shaped conductive liner on opposing sidewalls of the fin, and forming a first dielectric layer over the "L" shaped conductive liner, an upper portion of the fin extending above an uppermost surface of the "L" shaped conductive liner and the first dielectric layer. The method further includes forming a gate dielectric over the upper portion of the fin, and forming a gate electrode over the gate dielectric.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor device, the method comprising:
   forming a first dielectric layer along sidewalls of a fin extending from a substrate;
   forming a conductive layer over the first dielectric layer;
   forming a second dielectric layer over the conductive layer;
   recessing the first dielectric layer, the conductive layer, and the second dielectric layer, thereby exposing an upper portion of the fin;

forming a gate dielectric over the upper portion of the fin; and forming a gate electrode over the gate dielectric.

2. The method of claim 1, further comprising, prior to forming the conductive layer, forming a third dielectric layer over the substrate adjacent to the fin, wherein the conductive layer is formed over the third dielectric layer.

3. The method of claim 2, further comprising, prior to forming the gate dielectric, forming a fourth dielectric layer over the conductive layer, the fourth dielectric layer separating the gate dielectric from the conductive layer.

4. The method of claim 3, further comprising electrically coupling a voltage source to the conductive layer.

5. The method of claim 4, wherein the conductive layer comprises a "L" shaped layer extending over an upper surface of the third dielectric layer.

6. The method of claim 1, wherein the conductive layer comprises a "L" shaped layer extending over an upper surface of the substrate.

7. The method of claim 6, further comprising, prior to forming the conductive layer, implanting dopants into the substrate using the first dielectric layer as a mask.

8. The method of claim 7, further comprising, prior to implanting dopants into the substrate, forming a spacer along a sidewall of the first dielectric layer.

9. The method of claim 7, prior to forming the gate dielectric, forming a third dielectric layer over the conductive layer, the third dielectric layer separating the gate dielectric and the conductive layer.

10. A method of forming a semiconductor device, the method comprising:
    etching a semiconductor substrate to form a recess in the semiconductor substrate, wherein an un-recessed portion of the semiconductor substrate between opposite portions of the recess forms a semiconductor strip;
    forming a first dielectric layer on sidewalls of the semiconductor strip;
    forming a conductive liner on sidewalls of the first dielectric layer;
    filling the recess to form an isolation region;
    recessing the conductive liner and the isolation region, wherein a portion of the semiconductor strip forms a semiconductor fin over a remaining portion of the isolation region;
    forming a gate dielectric on sidewalls and a top surface of the semiconductor fin; and
    forming a gate electrode overlying the gate dielectric, wherein the gate electrode and the gate dielectric overlap the conductive liner, and wherein the gate dielectric and the gate electrode form parts of a Fin Field-Effect Transistor (FinFET).

11. The method of claim 10, further comprising, before forming the conductive liner, implanting a portion of the semiconductor substrate underlying the recess to form a doped region, wherein the conductive liner comprises a horizontal portion overlying and contacting the doped region.

12. The method of claim 10, further comprising:
    before forming the conductive liner, forming a second dielectric layer to cover a bottom of the recess; and
    coupling a voltage source to the conductive liner, wherein the voltage source is configured to provide a positive bias voltage or a negative bias voltage to the conductive liner.

13. The method of claim 10, further comprising:
    after recessing the conductive liner and the isolation region and before the forming the gate dielectric, forming a second dielectric layer overlapping the isolation region and the conductive liner.

14. The method of claim 10, wherein the forming the conductive liner comprises:
    forming a doped polysilicon region on the sidewalls of the first dielectric layer, wherein the doped polysilicon region has a conductivity type opposite to a conductivity type of source and drain regions of the FinFET.

15. The method of claim 10, wherein the forming the conductive liner comprises forming a mid-gap metal layer on the sidewalls of the first dielectric layer.

16. A method of forming a semiconductor device, the method comprising:
    forming a fin extending from a substrate;
    forming an "L" shaped conductive liner on opposing sidewalls of the fin;
    forming a first dielectric layer over the "L" shaped conductive liner, an upper portion of the fin extending above an uppermost surface of the "L" shaped conductive liner and the first dielectric layer;
    forming a gate dielectric over the upper portion of the fin; and
    forming a gate electrode over the gate dielectric.

17. The method of claim 16, further comprising, prior to forming the "L" shaped conductive liner, forming a second dielectric layer, the second dielectric layer separating the "L" shaped conductive liner from the fin.

18. The method of claim 17, further comprising, prior to forming the "L" shaped conductive liner, implanting dopants into the substrate along opposing sides of the fin.

19. The method of claim 18, further comprising, prior to forming the gate dielectric, forming a third dielectric layer over the "L" shaped conductive liner.

20. The method of claim 16, further comprising, prior to forming the "L" shaped conductive liner, forming a second dielectric layer over the substrate on opposing sides of the fin, wherein the "L" shaped conductive liner extends over an upper surface of the second dielectric layer.

* * * * *